United States Patent [19]
Boser

[11] Patent Number: 4,644,259
[45] Date of Patent: Feb. 17, 1987

[54] NONDESTRUCTIVE TESTING OF MULTILAYER CERAMIC CAPACITORS

[75] Inventor: Otmar H. Boser, Scarsdale, N.Y.

[73] Assignee: North American Philips Corporation, New York, N.Y.

[21] Appl. No.: 666,804

[22] Filed: Oct. 31, 1984

[51] Int. Cl.[4] ............................................. G01R 31/02
[52] U.S. Cl. ......................................... 324/51; 324/56
[58] Field of Search ..................... 324/56, 60 C, 60 R, 324/61 QS, 61 R, DIG. 1, 57 R, 57 Q, 80, 81, 109, 51

[56] References Cited

U.S. PATENT DOCUMENTS

| | | | |
|---|---|---|---|
| 3,230,448 | 1/1966 | Norrelgen | 324/56 |
| 3,832,630 | 8/1974 | Micol et al. | 324/56 |
| 4,583,038 | 4/1986 | Chittick | 324/51 |

OTHER PUBLICATIONS

Baker, Multilayer Ceramic Capacitors Testing Methods, Bell Laboratories Inc., Jul. 1980, pp. 1-99.

Primary Examiner—Reinhard J. Eisenzopf
Assistant Examiner—Jack B. Harvey
Attorney, Agent, or Firm—Norman N. Spain

[57] ABSTRACT

A method for nondestructive testing of multilayer ceramic capacitors exhibiting piezoelectric effects only during poling by a bias voltage to determine the presence or absence of delaminations. The capacitor is inserted in an impedance bridge, a bias voltage of 1 to 2.5 times the rated voltage is applied and the impedance is measured as a function of frequency. A lower than expected impedance indicates a defective capacitor.

2 Claims, 10 Drawing Figures

FIG. 1
GOOD
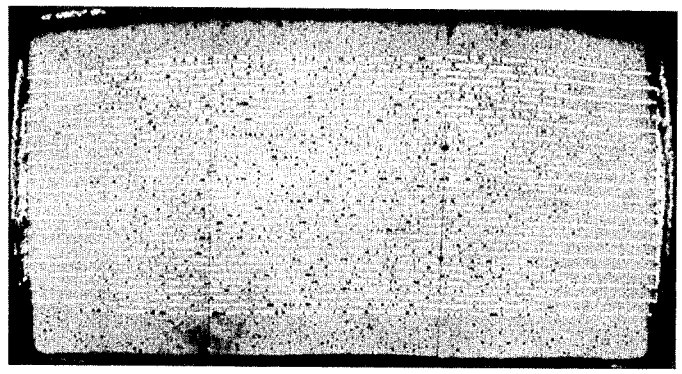
|— 0.05" —|
BAD
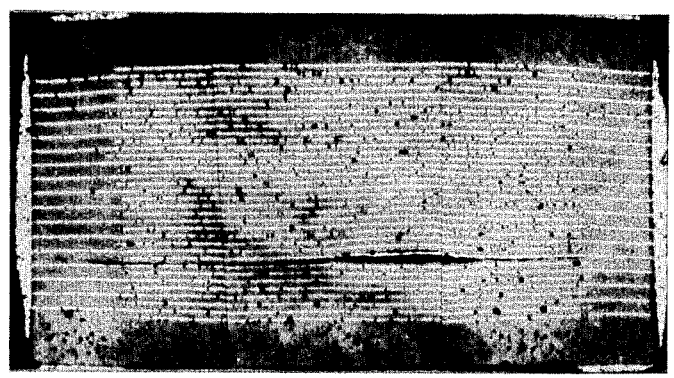
TYPE : Z5U
SIZE : 0.10" x 0.05" x 0.05"
CAPACITANCE : 100nF
FIG. 2

FIG.5A
GOOD
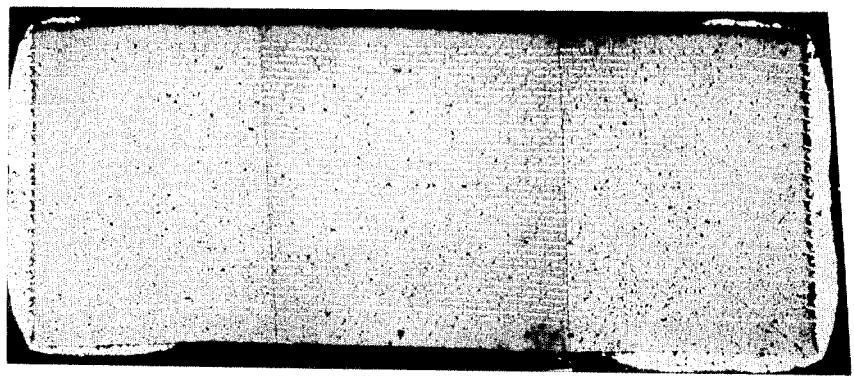
|←— 0.05" —→|
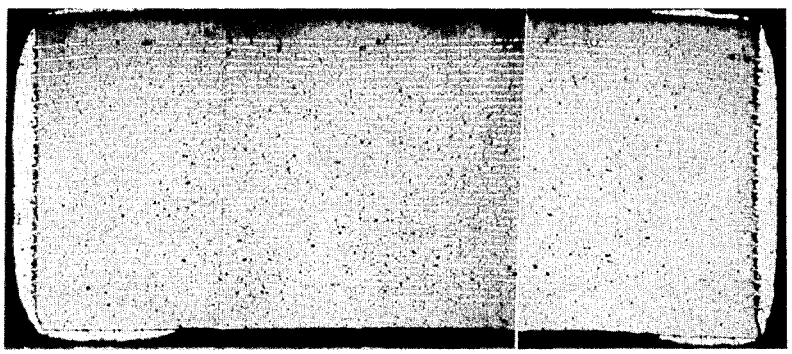
TYPE : X7R
SIZE : 0.125" x 0.095" x 0.055"
CAPACITANCE : 67nF
FIG.5B

FIG.7A
BAD
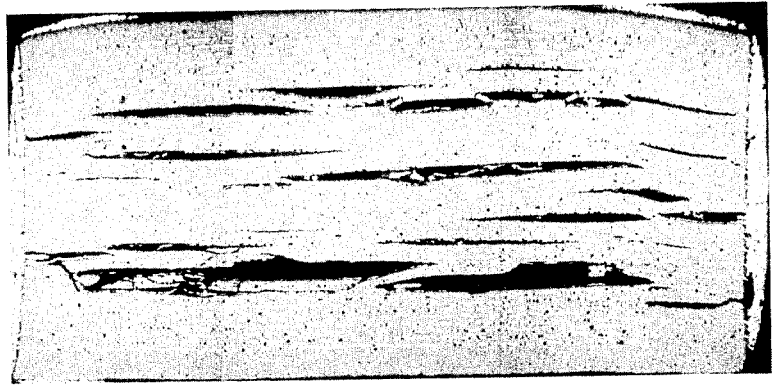
0.05"
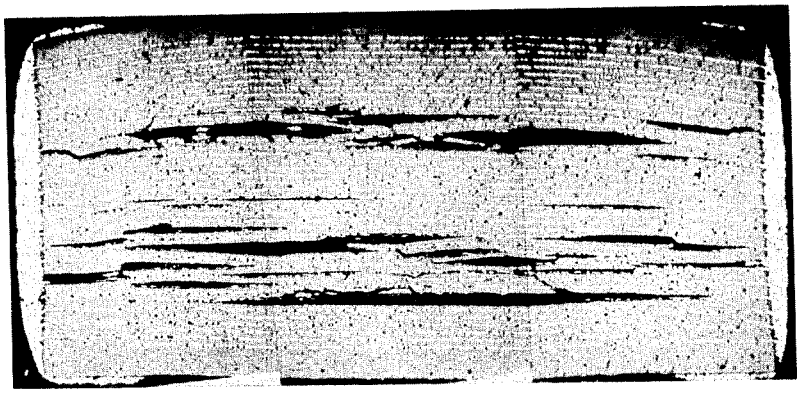
TYPE : X7R
SIZE : 0.125" x 0.095" x 0.055"
CAPACITANCE : 67nF
FIG.7B

NONDESTRUCTIVE TESTING OF MULTILAYER CERAMIC CAPACITORS

BACKGROUND OF THE INVENTION

1. Field of the Invention

This invention pertains to the field of nondestructive testing and in particular to the nondestructive testing of multilayer ceramic capacitors. Specifically, this method of nondestructive testing is directed to discovery of delaminations and nonvisible cracks in a ceramic capacitor body.

2. Description of the Prior Art

In the prior art, the testing of multilayer ceramic capacitors for either delaminations or nonvisible cracks has been primarily destructive testing. As the name implies, this testing is restricted to samples of a lot and consequently is not effective with respect to individual units within the lot. Though nondestructive testing has been suggested, however, few economically successful techniques have been developed to date. Among the proposed or attempted means of nondestructive testing, there have been at least four alternatives. Ultrasonic scanning is a form of bulk testing which to date has been unable to isolate individual defective units within a lot and consequently has not been very successful. Neutron radiography is a very complex and expensive means of testing but has not yet provided an adequate resolution. The scanning laser acoustic microscope provides a very expensive means of testing but it does rely on human judgment and is relatively slow. Testing by acoustic emission is a very slow process.

The delamination of the layers in a multilayer ceramic capacitor shortens the life of the device, significantly decreases its reliability and causes problems in soldering related to thermal expansion. The delamination of layers in a multilayer ceramic capacitor is not detected by the usual capacitance and resistance tests.

SUMMARY OF THE INVENTION

The present invention provides a means to determine the quality of multilayer ceramic capacitors, and in particular the absence of delaminations or other nonvisible cracks in the ceramic material. Certain classes of multilayer ceramic capacitors, when poled by a bias voltage, show piezoelectric effects. Standing acoustic waves are set up corresponding to the dimensions of the ceramic chip capacitor. Where delaminations are present, the resonance pattern is disturbed and the resulting changes can be used to distinguish delaminated capacitors from good or acceptable capacitors. The resonances occur generally between 0.25 MHz and 6 MHz. At these high frequencies testing can be very rapid with a potential for testing 6,000 capacitors per hour.

BRIEF DESCRIPTION OF THE DRAWINGS

FIGS. 1 and 2 are micrographs of good (acceptable) and bad (defective) Z5U ceramic capacitors taken in cross-section.

FIGS. 5a and 5b are micrographs of good X7R ceramic capacitors, the pictures being taken in cross-section.

FIGS. 7a and 7b are micrographs of bad X7R capacitors taken in cross-section.

DESCRIPTION OF THE PREFERRED EMBODIMENT

The present invention is directed to a method of nondestructive testing to determine the presence or absence of delaminations and concealed cracks within multilayer ceramic capacitors manufactured from materials having piezoelectric properties. In terms of the EIA standard designations and codes, the present method of nondestructive testing applies to what are known as class II and class III capacitors. These capacitors basically include materials which exhibit piezoelectric effects. Such capacitors would include capacitors of the types known in the trade as Z5U and X7R. It is possible with capacitors made from these materials to excite mechanical waves through electrical means. The frequency to match the mechanical resonance is determined by the length, width and height of the device made from these materials. When an electric field of one to two times rated voltage is applied, a mechanical wave feeds back a measure of the impedance. When this DC field is applied to the devices individually, standing acoustic waves are set up corresponding to the dimensions of the ceramic chip capacitor. If delaminations or hidden cracks are present, the resonance pattern is disturbed and the resulting changes can be used to distinguish the delaminated capacitors from good (acceptable) capacitors. Resonances occur generally between 0.25 MHz and 5 MHz.

The method of the present invention involves the following steps. The first step is to determine the resonance frequency and the impedance at resonance for a good (acceptable) ceramic capacitor of a specific size, materials and capacitance. A typical multilayer ceramic capacitor of that same size, capacitance and materials specified above is inserted into an impedance measurement bridge. A bias voltage is applied, this voltage being between 1 and 2.5 times the rated voltage of the capacitor. The impedance is then measured as a function of frequency. In the determination of what is a good or acceptable versus a bad or defective ceramic capacitor a high impedance at the resonance frequency indicates a good capacitor. In the case of a bad or defective ceramic capacitor, the impedance will be low.

Figure 3:
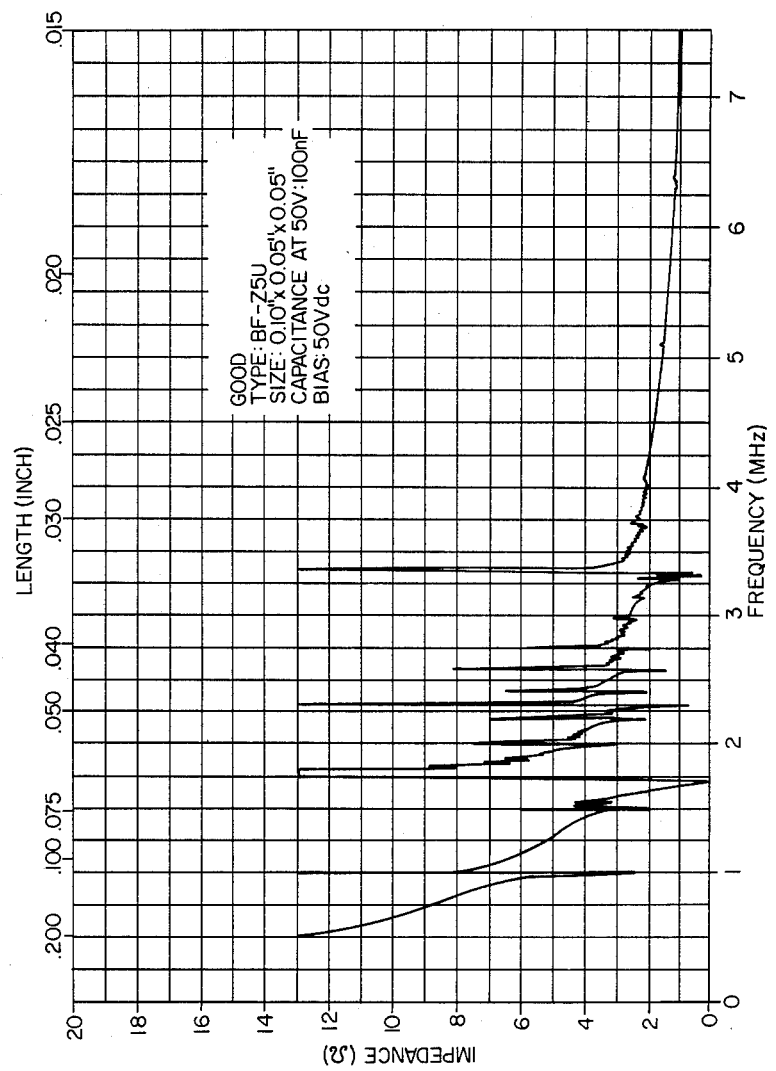
FIGS. 3 and 4 are impedance versus frequency curves for the good and bad Z5U capacitors depicted in FIGS. 1 and 2.
Figure 4:
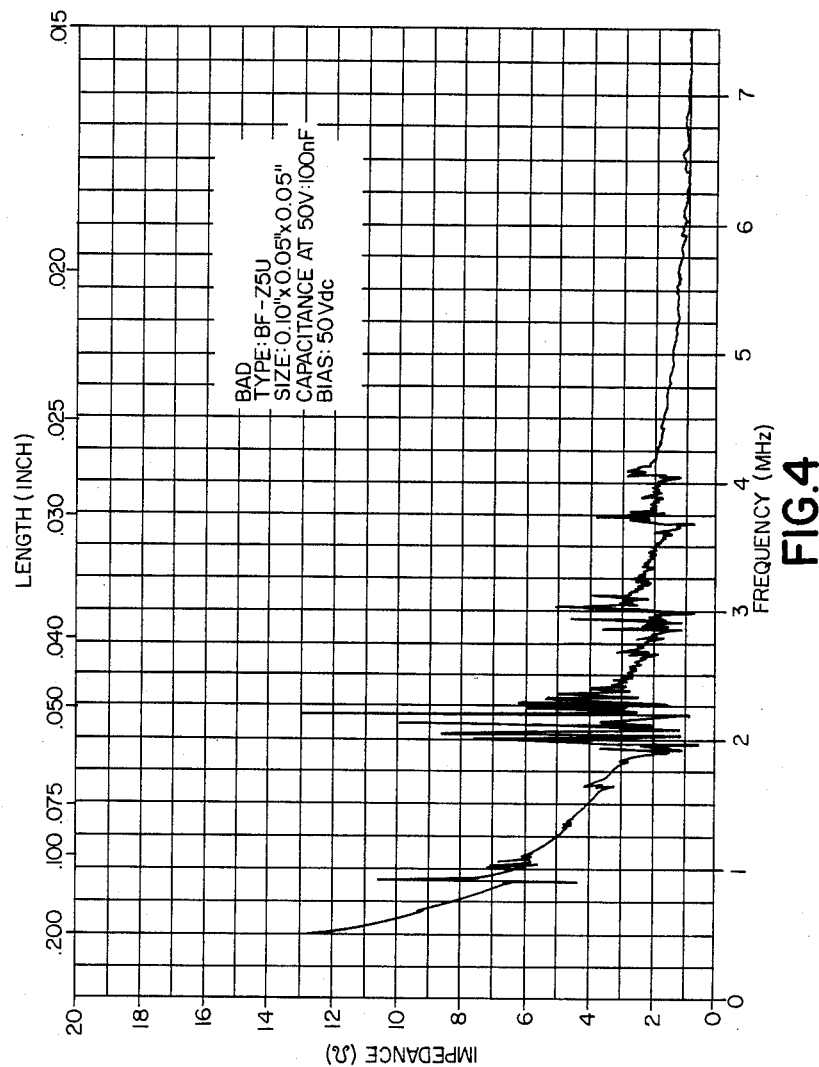

The figures present some examples which illustrate the method of the present invention. In FIGS. 1 and 2 there are presented illustrations of good and bad capacitors of the type Z5U with a size of 0.10 inches×0.05 inches×0.05 inches and having a capacitance of 100 nanofarads. It is evident from the micrograph of FIG. 2 that there is a delamination in the lower third of the capacitor. The measured resonance frequency for the capacitor of FIG. 1 yields a $f_L$ of approximately 1 MHz and a $f_{W,H}$ of approximately 1.7 MHz with the velocity $v = 5 \times 10^3$ meters/second. The terms $f_L$, $f_W$ and $f_H$ specify the resonance frequency along the length, width, and height respectfully of the capacitor. The term "velocity v" means sound velocity in the capacitor material. The resonance $f_L$ occurs for example when the length L times the frequency $f_L$ is equal to the sound velocity V. Turning now to the graphs of FIGS. 3 and 4, in FIG. 3 one can determine that at 1.7 MHz, the impedance of the tested device of FIG. 1 is relatively high and consequently the capacitor is a good capacitor. In FIG. 4 the impedance of the tested device of FIG. 2 at 1.7 MHz is substantially less than that shown for a good capacitor in FIG. 3 and consequently there are delaminations or defects in that capacitor, as shown in FIG. 2.

Figure 6:
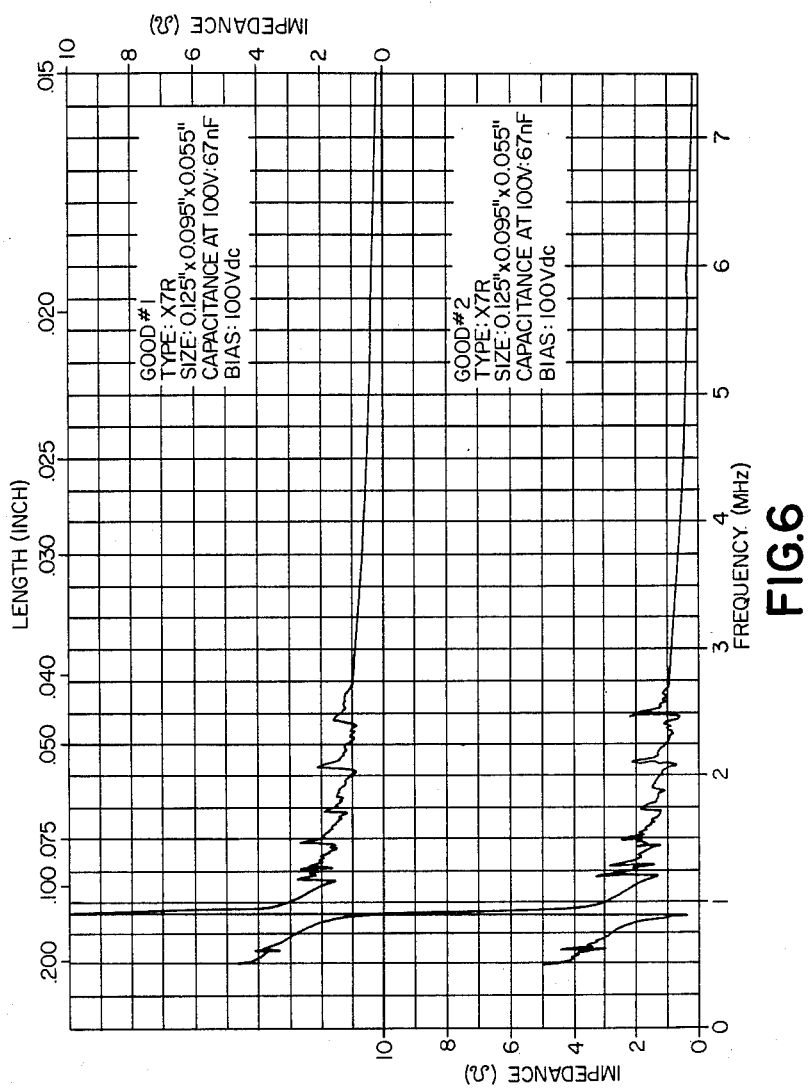
FIG. 6 is a graph of impedance versus frequency for the capacitors of FIGS. 5a and 5b.
Figure 8:
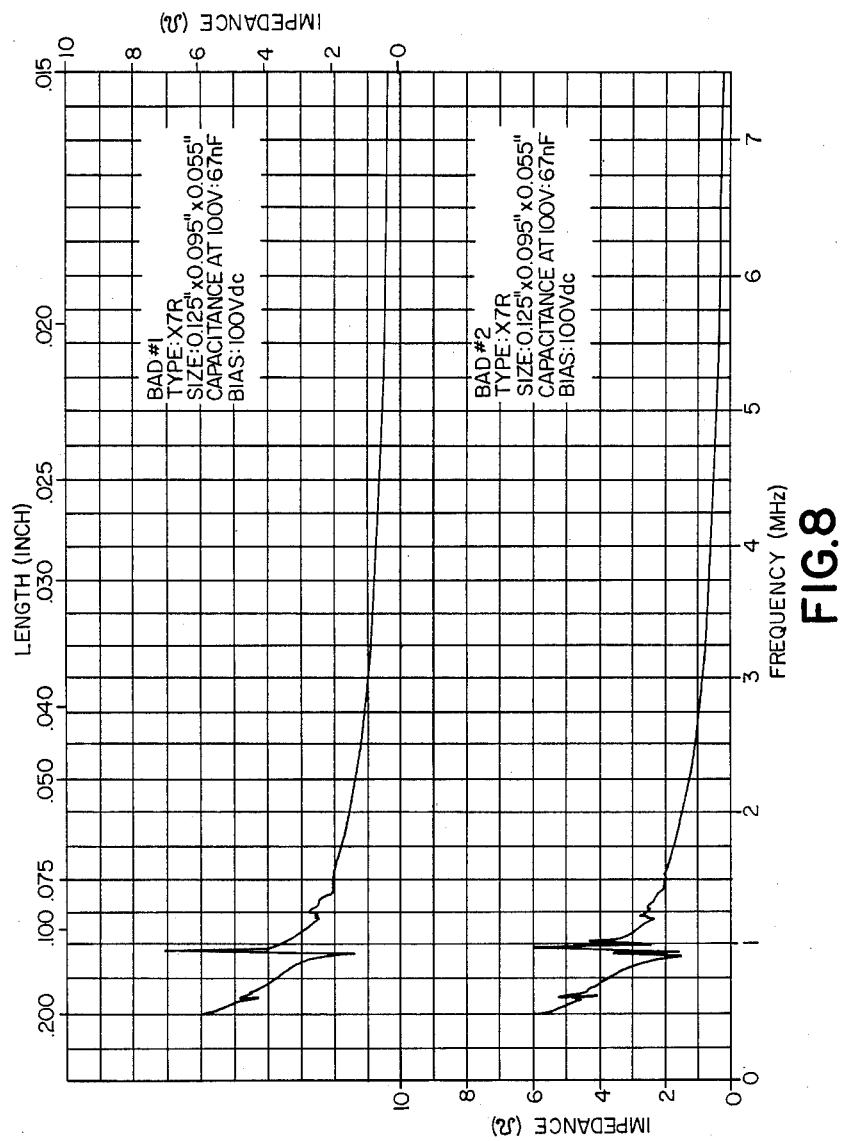
FIG. 8 is a graph of the impedance versus frequency curves for the capacitors of FIGS. 7a and 7b.

FIGS. 5a and 5b are micrographs of good (acceptable) multilayer ceramic capacitors of the type X7R having the size of 0.125 inches×0.095 inches×0.055 inches and a capacitance of 67 nanofarads. The measured resonance frequency for these capacitors of FIGS. 5a and 5b is $f_L=0.625$ MHz, and $f_W=0.875$ MHz. Turning to the graph of FIG. 6, one notices that at 0.625 MHz the impedance is very high, and at 0.875 MHz, the resonance frequency corresponding to this width, the impedance is also high. This is true for both specimens. In FIGS. 7a and 7b, there are micrographs of two bad (defective) multilayer ceramic capacitors of the type X7R having the same measurements as the capacitors of FIGS. 5a and 5b. The delaminations in these capacitors are quite obvious from the photographs. Turning now to the graphs measuring the impedance versus the frequency for these bad capacitors, one notes that at the resonance frequencies of 0.625 MHz and 0.875 MHz, the measured impedance is significantly less than that for the good capacitors.

Consequently, a good (acceptable) capacitor can be recognized by a large impedance value at the measured resonance frequencies. A bad (defective) capacitor can be recognized by the change in impedance which appears at resonance frequencies between a good and a bad capacitor. The impedance values at resonance are significantly lowered for a bad capacitor.

I claim:

1. A method for non-destructive testing of multilayer ceramic capacitors exhibiting piezoelectric effects only during poling by a bias voltage to determine the presence of delamination of the layers and non-visible cracks in said capacitors comprising the steps of:

determining the resonance frequency and the impedance at resonance for a specific size and type of capacitor;

inserting sequentially a number of capacitors of said specific type and size in an impedance bridge;

applying a bias voltage to each of said capacitors sequentially, said voltage being between 1 and 2.5 times the rated voltage of said capacitors;

measuring sequentially the impedance of each of said capacitors as a function of frequency;

comparing said impedances to an expected impedance, such that capacitors having shifts to lower than expected impedance values at resonance frequencies are rejected as defective.

2. A method for non-destructive testing of a multilayer ceramic capacitor exhibiting piezoelectric effects only during poling by a bias voltage to determine the presence of delamination of the layers and non-visible cracks in said capacitor comprising the steps of:

determining the expected resonance frequency and the expected impedance at resonance for said specific of capacitor;

inserting said capacitor in an impedance bridge;

applying a bias voltage to said capacitor, said voltage being between 1 and 2.5 times the rated voltage of said capacitor;

measuring the impedance of said capacitor as a function of frequency;

comparing said impedance to said expected impedance, such that a lower than expected impedance value at resonance frequencies indicates that said capacitor is defective.

* * * * *